US012562346B2

(12) United States Patent
Yoo et al.

(10) Patent No.: US 12,562,346 B2
(45) Date of Patent: Feb. 24, 2026

(54) APPARATUS FOR PROCESSING SUBSTRATE

(71) Applicant: PSK INC., Gyeonggi-do (KR)

(72) Inventors: Kwang-Sung Yoo, Gyeonggi-do (KR);
Geon-Jong Kim, Gyeonggi-do (KR);
Tae-Hwan Youn, Gyeonggi-do (KR)

(73) Assignee: PSK Inc., Gyeonggi-do (KR)

( * ) Notice: Subject to any disclaimer, the term of this
patent is extended or adjusted under 35
U.S.C. 154(b) by 133 days.

(21) Appl. No.: 18/686,132

(22) PCT Filed: Oct. 29, 2021

(86) PCT No.: PCT/KR2021/015417
§ 371 (c)(1),
(2) Date: Feb. 23, 2024

(87) PCT Pub. No.: WO2023/027244
PCT Pub. Date: Mar. 2, 2023

(65) Prior Publication Data
US 2024/0379332 A1     Nov. 14, 2024

(30) Foreign Application Priority Data

Aug. 23, 2021    (KR) ........................ 10-2021-0110825

(51) Int. Cl.
*H01J 37/32*          (2006.01)
(52) U.S. Cl.
CPC .... *H01J 37/32522* (2013.01); *H01J 37/3244*
(2013.01); *H01J 37/32568* (2013.01); *H01J*
*37/32715* (2013.01); *H01J 2237/334* (2013.01)
(58) Field of Classification Search
CPC ............. H01J 37/32522; H01J 37/3244; H01J
37/32568; H01J 37/32715; H01J
2237/334; H01J 37/32; H01L 21/67;
H01L 21/687
See application file for complete search history.

(56) References Cited

U.S. PATENT DOCUMENTS

2011/0140023 A1    6/2011  Sauer et al.
2015/0311042 A1*  10/2015  Son ..................... H01L 21/6719
                                                           118/723 R
2022/0059324 A1*   2/2022  Lee ..................... H01L 21/6838

FOREIGN PATENT DOCUMENTS

CN        101517185 A      8/2009
CN        102275757 A  * 12/2011
                (Continued)

OTHER PUBLICATIONS

International Search Report dated May 19, 2022, in International
Application No. PCT/KR2021/015417.

*Primary Examiner* — Abdullah A Riyami
*Assistant Examiner* — Syed M Kaiser
(74) *Attorney, Agent, or Firm* — Procopio, Cory,
Hargreaves & Savitch LLP

(57)          ABSTRACT

The present invention provides an apparatus for processing
a substrate. The apparatus for processing a substrate may
comprise: a first housing; a second housing combined with
the first housing to define an internal space; a rotation
coupling part for O fastening the first housing and the second
housing to each other such that one of the first housing and
the second housing is rotatable with respect to the other one
of the first housing and the second housing; and a channel
which supplies a fluid to the internal space or discharges the
fluid from the internal space, and has at least a part thereof
inserted into a pin hole formed in the rotation coupling part.

7 Claims, 7 Drawing Sheets

(56)     References Cited

FOREIGN PATENT DOCUMENTS

| JP | 2004255116 | A | | 9/2004 | | |
| KR | 101585928 | B1 | | 1/2016 | | |
| KR | 101710945 | B1 | * | 2/2017 | ............. | H01L 21/22 |
| KR | 102275757 | B1 | * | 7/2021 | ....... | H01L 21/67069 |
| TW | 200737307 | A | | 10/2007 | | |

* cited by examiner

[FIG. 1]
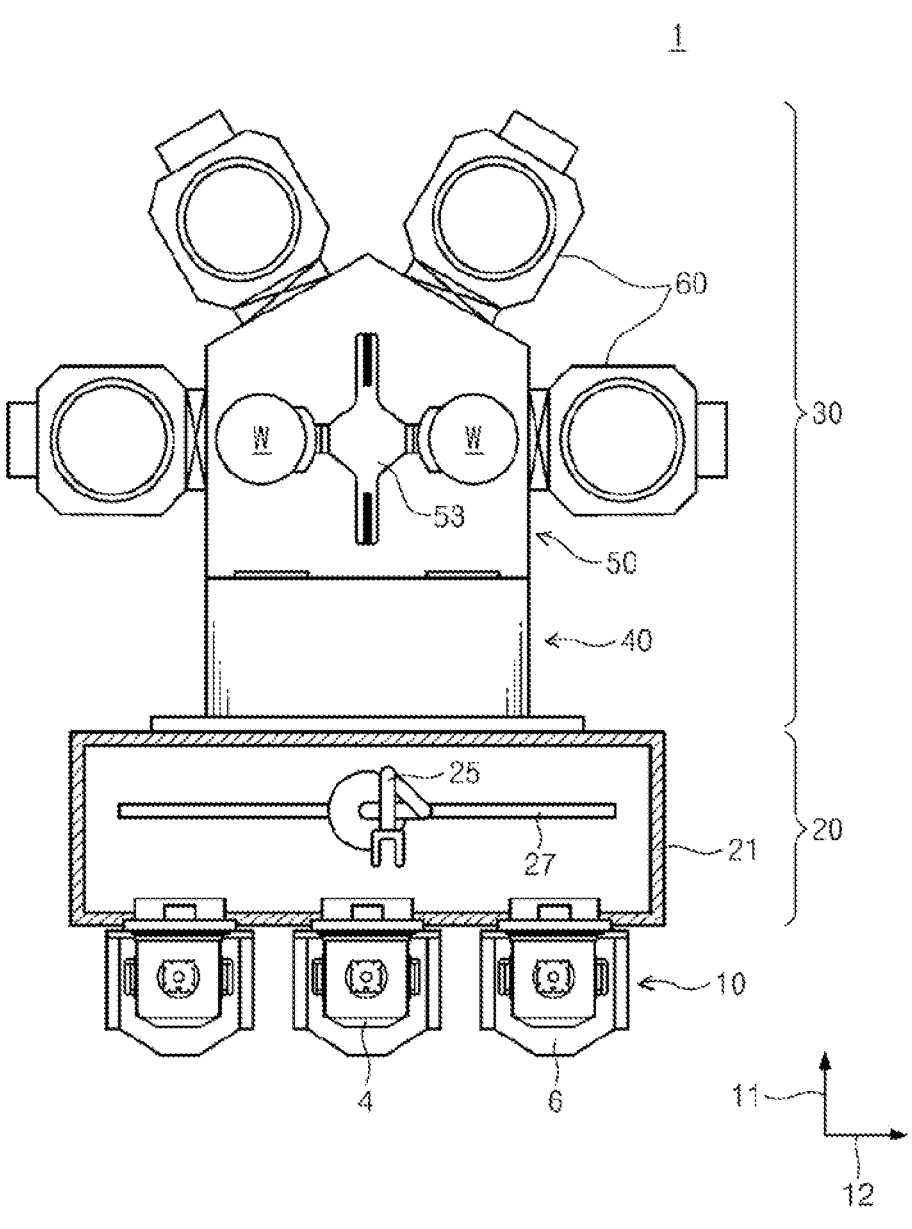

[FIG. 2]
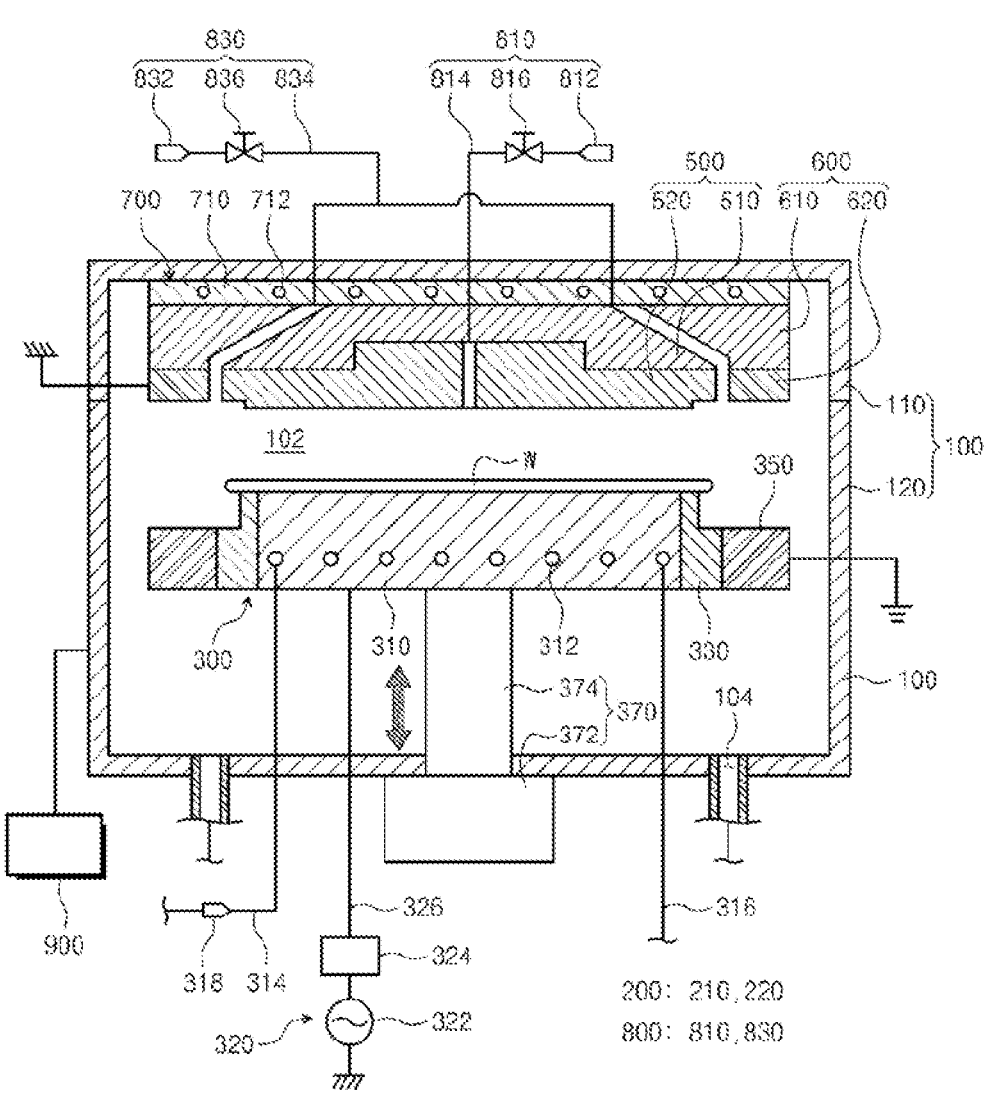

[FIG. 3]
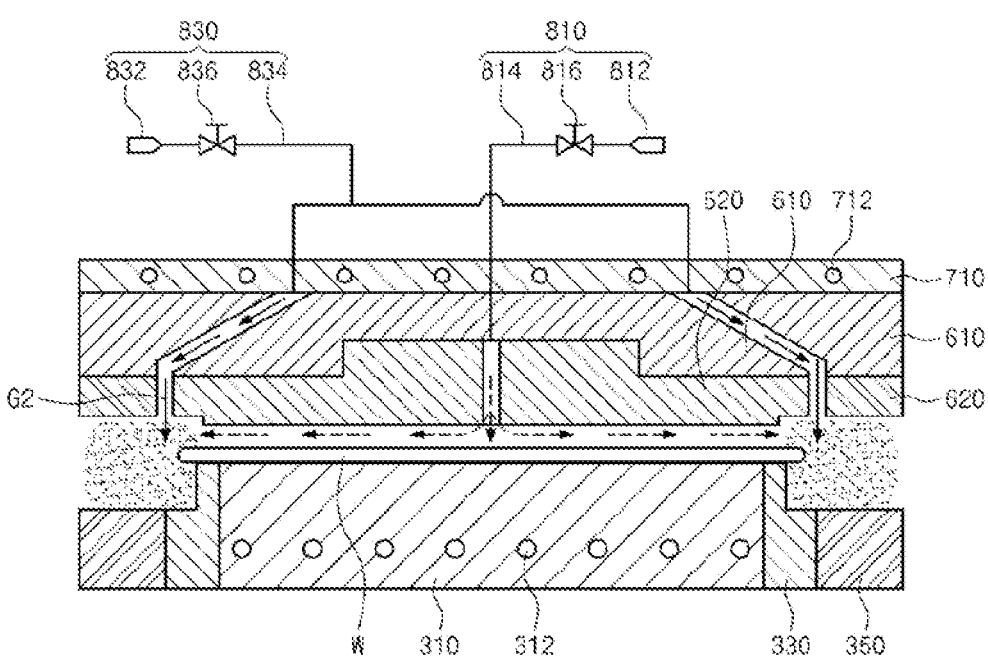

[FIG. 4]
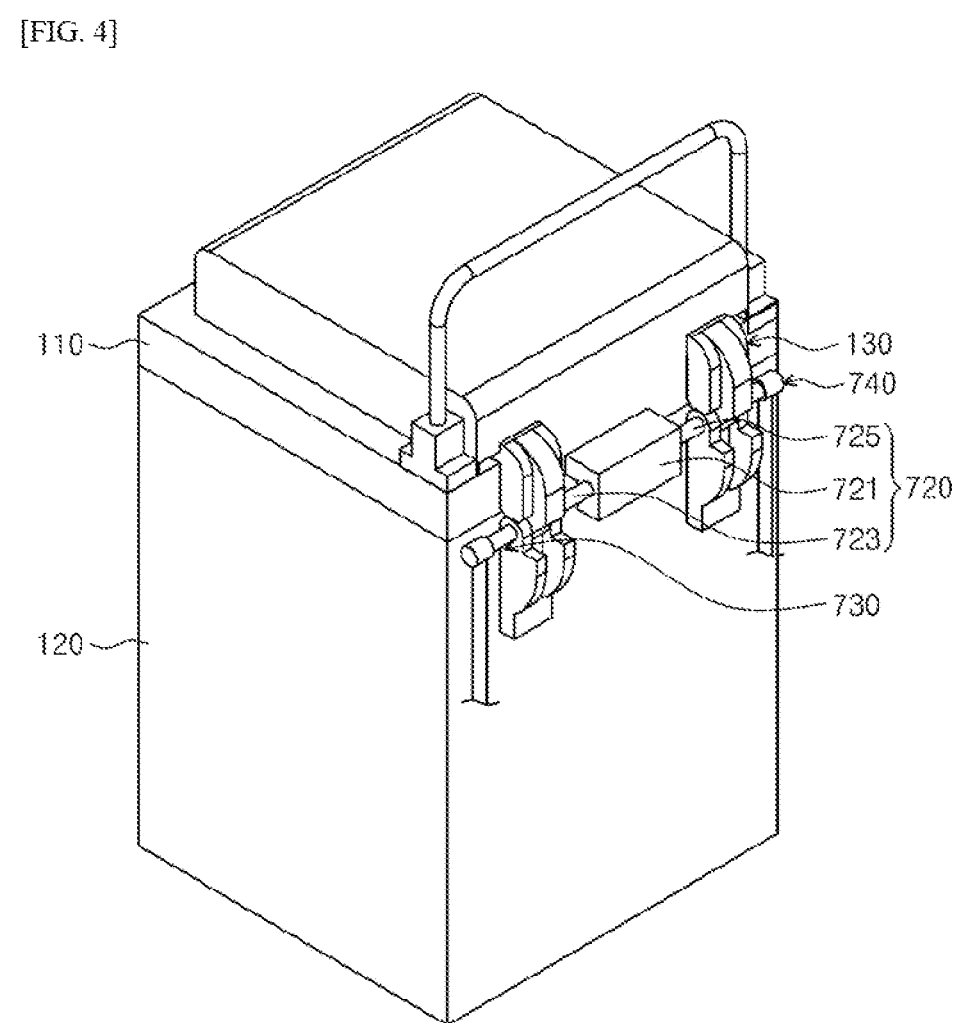

[FIG. 5]
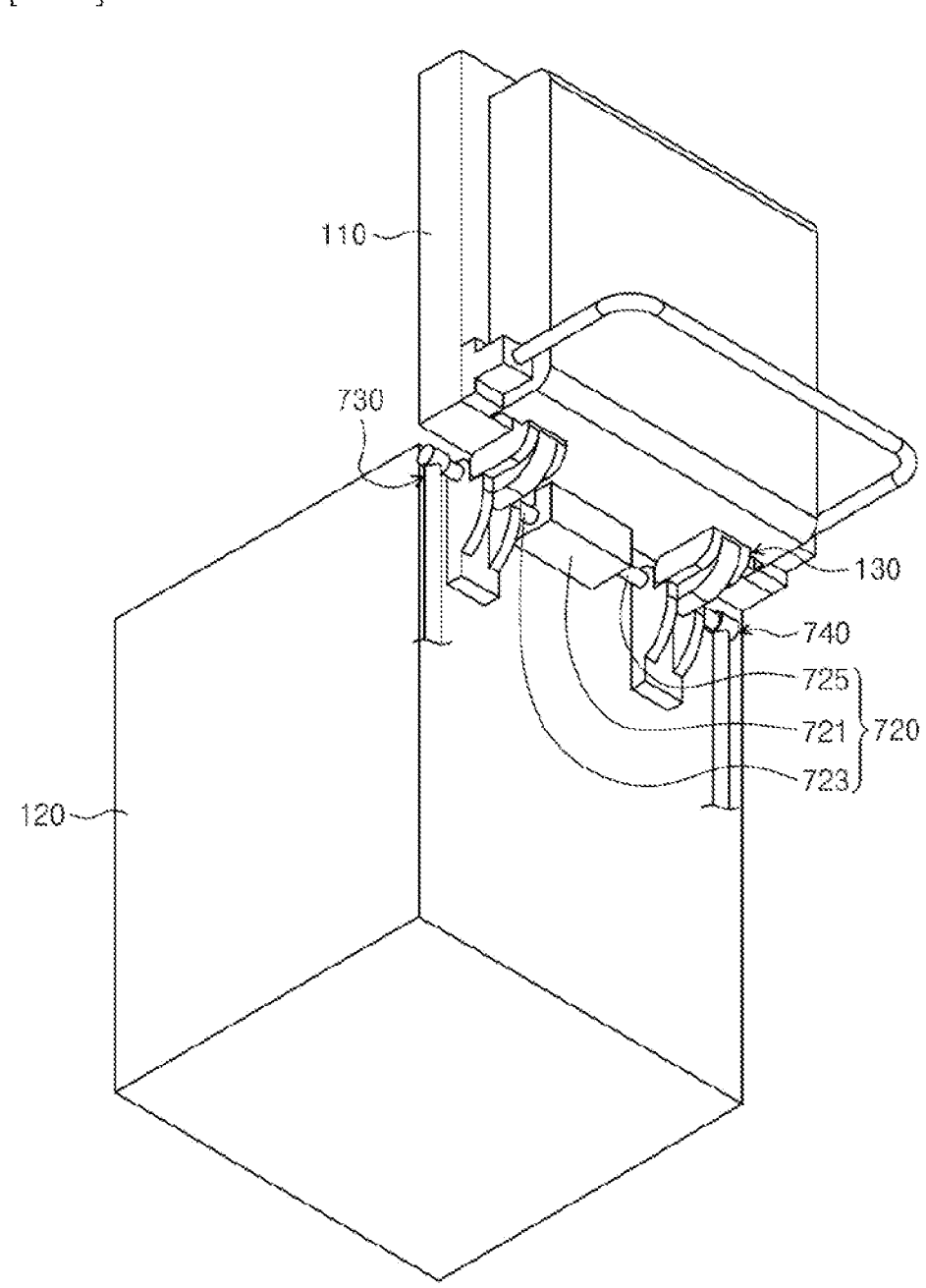

[FIG. 6]
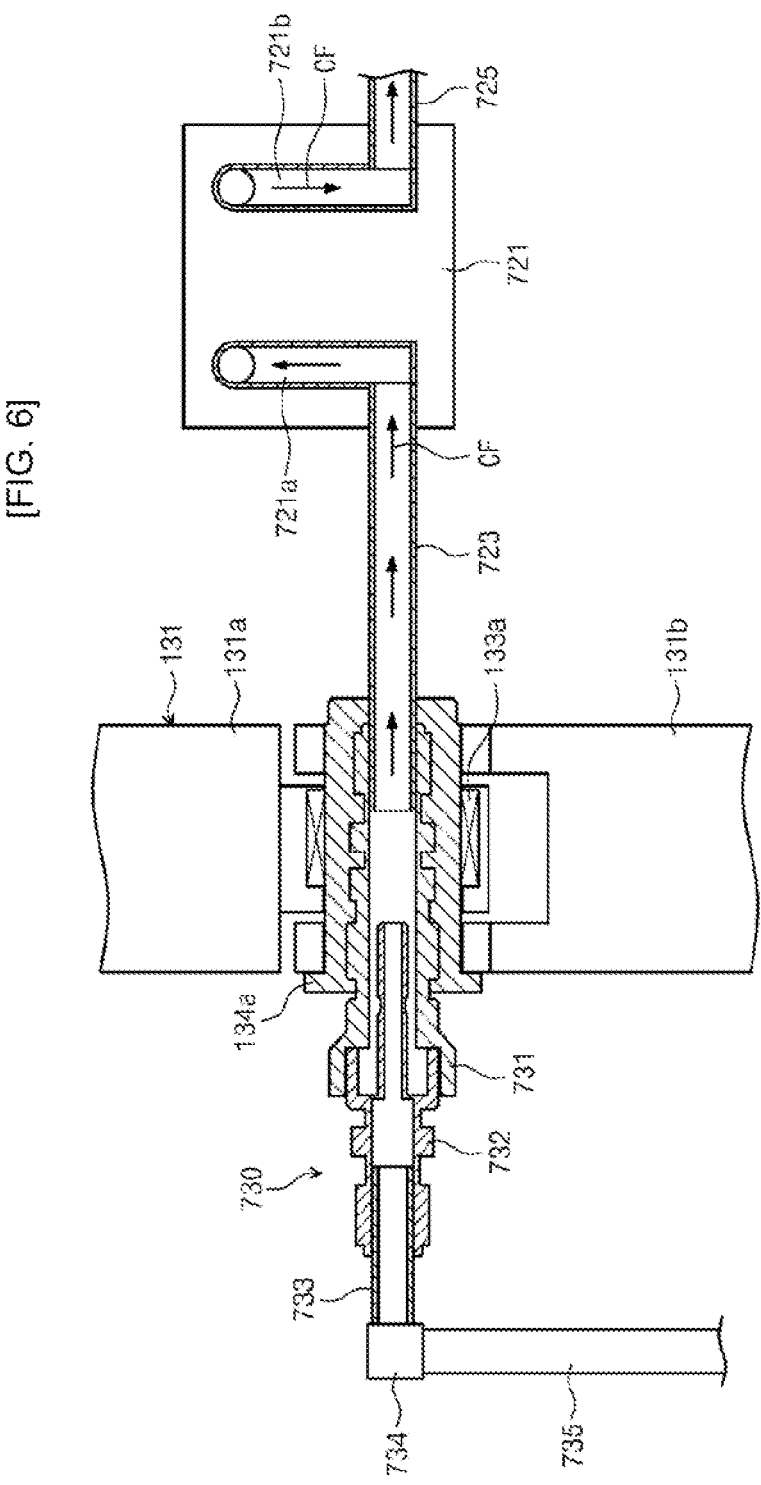

[FIG. 7]
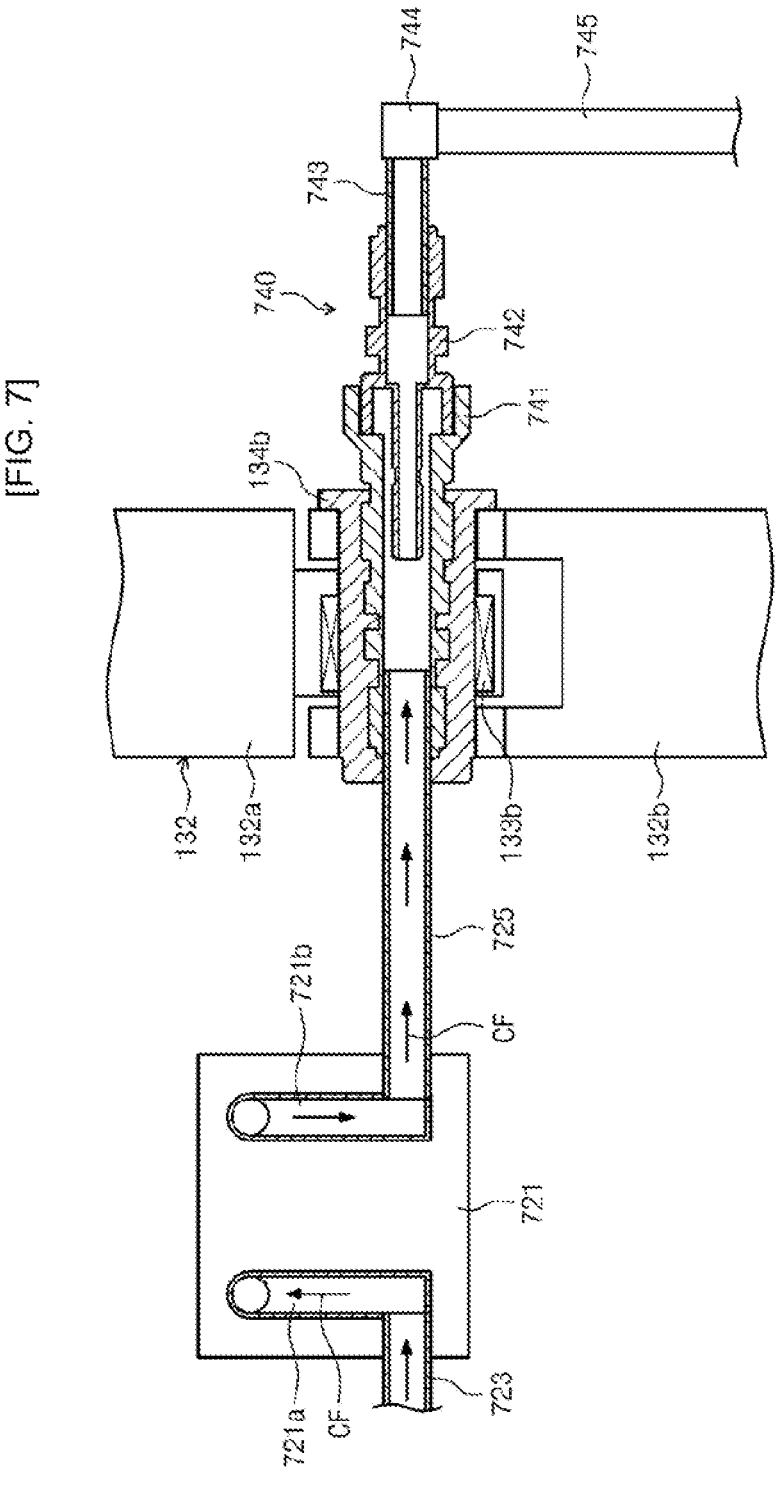

APPARATUS FOR PROCESSING SUBSTRATE

CROSS-REFERENCE TO RELATED APPLICATION

This patent application is a national phase entry of international patent application No. PCT/KR2021/015417 filed on Oct. 29, 2021, which claims the benefit of Korean patent application No. 10-2021-0110825 filed on Aug. 23, 2021, the entire disclosures of which are expressly incorporated herein by reference.

TECHNICAL FIELD

The present invention relates to a substrate processing apparatus.

BACKGROUND ART

Plasma refers to an ionized gas state formed of ions, radicals, electrons, and the like, and is generated by a very high temperature, strong electric fields, or RF electromagnetic fields. The semiconductor device manufacturing process includes an ashing or etching process that uses plasma to remove a film on a substrate. The ashing or etching process is accomplished by ion and radical particles contained in the plasma colliding or reacting with the film on the substrate. The process of processing a substrate with plasma may be accomplished in a variety of ways.

On the other hand, various types of fluids are supplied into the plasma treatment apparatus that performs the plasma treatment process. For example, during the processing of substrate, such as a wafer, is being processed by plasma, the temperature of the device may increase, and to prevent the temperature of the plasma treatment device from increasing excessively, a cooling fluid such, as coolant, is supplied to the device. The fluid is supplied to the plasma treatment device via flexible lines, which are elastic pipes.

These flexible lines may be damaged as the plasma treatment device is driven. For example, to load or unload substrates into or from the plasma treatment device, the plasma treatment device may perform an open/close operation, which causes continuous damage to the flexible lines as the operation is repeated. As a result, the durability of the flexible line is weakened. To solve this problem, a method of increasing the length of the flexible line may be considered, but this is not appropriate because the space occupied by the flexible line is increased.

Technical Problem

The present invention aims to provide a substrate processing apparatus capable of effectively supplying a fluid into a housing having an open interior space or a closed interior space.

Further, the present invention aims to provide a substrate processing apparatus that is capable of effectively supply a fluid into a housing without using a flexible line.

Furthermore, the present invention aims to provide a substrate processing apparatus that is capable of minimizing an occupied area.

The problem to be solved by the present invention is not limited to the above-mentioned problems, and the problems not mentioned will be clearly understood by those skilled in the art from the present specification and the accompanying drawings.

Technical Solution

An exemplary embodiment of the present invention provides an apparatus for processing a substrate, the apparatus including: a first housing; a second housing combined with the first housing with each other to define an interior space; a rotary coupling part for engaging the first housing and the second housing with each other, such that one of the first housing and the second housing is rotatable relative to the other of the first housing and the second housing; and a channel for supplying a fluid to the interior space or for discharging the fluid from the interior space, and having at least a portion inserted into a pin hole formed in the rotary coupling part.

In the exemplary embodiment, the rotary coupling part may include: a first hinge part coupled with the first housing; a second hinge part coupled with the second housing; and a hinge pin formed in a hollow shape and inserted into a pin hole in the first hinge part and a pin hole in the second hinge part.

In the exemplary embodiment, the channel may be inserted into a hollow space of the hinge pin.

In the exemplary embodiment, the apparatus may further include: a pipe for supplying or discharging a fluid into or from the channel; a rotary connector inserted into the hollow space, and engaged with the channel and rotating with rotation of the channel; and a fixed connector detachably provided to the rotary connector, provided to be independent of rotation of the rotary connector, and installed between the pipe and the rotary connector.

Another exemplary embodiment of the present invention provides an apparatus for processing a substrate, the apparatus including: a housing, the housing including an upper housing and a lower housing combined with the upper housing to define an interior space; a rotary coupling part for engaging the upper housing and the lower housing with each other, such that the upper housing is rotatable with respect to the lower housing; a plate coupled to the upper housing and formed with a flow path through which a fluid flows, wherein when the upper housing is in a closed position defining the interior space, the plate is disposed in the interior space; a fluid supply module for supplying a fluid from an exterior side of the housing to the flow path; and a fluid discharge module for discharging the fluid from the flow path to the exterior side of the housing, in which at least a portion of a flow path of the fluid flowing by the fluid supply module or the fluid discharge module passes through a pin hole formed in the rotary coupling part.

In the exemplary embodiment, the apparatus may further include a fluid block installed on an exterior side of the upper housing, and formed with a supply flow path and a discharge flow path that fluid-communicate with the flow path, in which the fluid supply module may be configured to supply the fluid to the flow path via the supply flow path, and the fluid discharge module may be configured to discharge the fluid from the flow path through the discharge flow path.

In the exemplary embodiment, the rotary coupling part may include: a first hinge part coupled with the upper housing; a second hinge part coupled with the lower housing; and a hinge pin formed in a hollow shape and inserted into a pin hole in the first hinge part and a pin hole in the second hinge part.

In the exemplary embodiment, the fluid supply module may include: a fluid supply channel connected with the supply flow path; a rotary connector engaged with the fluid supply channel which rotates with rotation of the upper housing—the rotary connector being inserted into a hollow space of the hinge pin; a supply pipe for supplying the fluid to the fluid supply channel; and a fixed connector disposed between the rotary connector and the supply pipe, and detachably provided to the rotary connector—the fixed connector being independent of rotation of the rotary connector.

In the exemplary embodiment, the fluid discharge module may include: a fluid discharge channel connected with the discharge channel; a rotary connector engaged with the fluid discharge channel which rotates with rotation of the upper housing—the rotary connector being inserted into a hollow space of the hinge pin; a discharge pipe for discharging the fluid from the fluid discharge channel; and a fixed connector disposed between the rotary connector and the discharge pipe, and detachably provided to the rotary connector—the fixed connector being independent of rotation of the rotary connector.

In the exemplary embodiment, the fluid supplied by the fluid supply module to the flow path may be a cooling fluid that controls a temperature of the plate.

In the exemplary embodiment, the apparatus may further include: a chuck for supporting a substrate in the interior space; a dielectric plate disposed to face an upper surface of the substrate supported by the chuck; a first gas supply unit for supplying inert gas to a center region of the substrate supported by the chuck; a second gas supply unit for supplying process gas to an edge region of the substrate supported by the chuck; a top edge electrode disposed above the edge region of the substrate supported by the chuck; a lower edge electrode disposed below the edge region of the substrate supported by the chuck; and a power source member for supplying RF power for generating plasma from the process gas.

Advantageous Effects

According to the exemplary embodiment of the present invention, the present invention may effectively supply a fluid into a housing with an open interior space or a closed interior space.

Further, according to the exemplary embodiment of the present invention, the present invention may effectively supply a fluid into the housing without the use of flexible lines.

Further, according to the exemplary embodiment of the present invention, the present invention may minimize the area occupied by the substrate processing apparatus.

The effect of the present invention is not limited to the foregoing effects, and the not-mentioned effects will be clearly understood by those skilled in the art from the present specification and the accompanying drawings.

DESCRIPTION OF DRAWINGS

FIG. 1 is a diagram schematically illustrating a substrate processing apparatus according to an exemplary embodiment of the present invention.

FIG. 2 is a cross-sectional view illustrating an exemplary embodiment of a substrate processing apparatus provided in a process chamber of FIG. 1.

FIG. 3 is a diagram illustrating an exemplary embodiment of the substrate processing apparatus of FIG. 2 performing a plasma treatment process.

FIG. 4 is a rear perspective view of the substrate processing apparatus of FIG. 2, when an upper housing is in a closed position.

FIG. 5 is a rear perspective view of the substrate processing apparatus, when the upper housing of FIG. 4 is in an open position.

FIG. 6 is a drawing illustrating a fluid supply structure for supplying a fluid into the housing.

FIG. 7 is a diagram illustrating a fluid discharge structure for discharging a fluid into the housing.

BEST MODE

Hereinafter, preferable exemplary embodiments according to exemplary embodiments of the present invention will be described with reference to accompanying drawings so as to be easily understood by a person ordinary skilled in the art. However, the present invention can be variously implemented and is not limited to the following exemplary embodiments. In the following description of the present invention, a detailed description of known functions and configurations incorporated herein is omitted to avoid making the subject matter of the present invention unclear. Also, throughout the drawings, the same reference numeral is used for parts that have similar functions and actions.

Further, when a part "includes" other constituent elements, this means that other constituent elements may be further included, rather than excluding other constituent elements, unless otherwise stated. In the present specification, it should be appreciated that terms "including" and "having" are intended to designate the existence of characteristics, numbers, steps, operations, constituent elements, and components described in the specification or a combination thereof, and do not exclude a possibility of the existence or addition of one or more other characteristics, numbers, steps, operations, constituent elements, and components, or a combination thereof in advance.

A singular expression includes a plural expression unless it is specifically described to the contrary in the context. Accordingly, shapes, sizes, and the like of the elements in the drawing may be exaggerated for clearer description.

Hereinafter, an exemplary embodiment of the present invention will be described with reference to FIGS. 1 to 7.

FIG. 1 is a diagram schematically illustrating a substrate processing apparatus according to an exemplary embodiment of the present invention. Referring to FIG. 1, a substrate processing apparatus 1 includes an Equipment Front End Module (EFEM) 20 and a processing module 30. The EFEM 20 and the processing module 30 are disposed in one direction.

The EFEM 20 includes a load port 10 and a transfer frame 21. The load port 10 is disposed at the front of the EFEM 20 in a first direction 11. The load port 10 includes a plurality of support parts 6. The support parts 6 are disposed in series in a second direction 12, and a carrier 4 (for example, a cassette, and an FOUP) in which a substrate W that is to be provided for a process and a processing completed substrate W is accommodated is seated on each support part 6. In the carrier 4, the substrate W to be provided to the process and the substrate W that has been completely processed are accommodated. The transfer frame 21 is disposed between the load port 10 and the processing module 30. The transfer frame 21 includes a first transfer robot 25 which is disposed therein and transfers the substrate W between the load port 10 and the processing module 30. The first transfer robot 25 moves along a transfer rail 27 provided in the second direction 12 to transfer the substrate W between the carrier 4 and the processing module 30.

The processing module 30 includes a load lock chamber 40, a transfer chamber 50, and a process chamber 60. The processing module 30 may treat the substrate W by receiving the substrate W from the EFEM 20.

The load lock chamber 40 is disposed adjacent to the transfer frame 21. In one example, the load lock chamber 40 may be disposed between the transfer chamber 50 and the EFEM 20. The load lock chamber 40 provides a waiting area for substrates W to be provided to the process before they are transferred to the process chamber 60, or for substrates W that have completely processed before they are transferred to the EFEM 20.

The transfer chamber 50 may transfer the substrate W. The transfer chamber 50 is disposed adjacent to the load lock chamber 40. The transfer chamber 50 has a polygonal body when viewed from the top. Referring to FIG. 1, the transfer chamber 50 has a pentagonal body when viewed from the top. On the outer side of the body, the load lock chamber 40 and the plurality of process chambers 60 are disposed along the circumference of the body. On each sidewall of the body, a passageway (not illustrated) is formed for the substrate W to enter and exit, and the passageway connects the transfer chamber 50 to the load lock chamber 40 or the process chambers 60. Each passageway is provided with a door (not illustrated) for opening and closing the passageway to seal the interior. A second transfer robot 53 which transfers the substrate W between the load lock chamber 40 and the process chambers 60 is disposed in an interior space of the transfer chamber 50. The second transfer robot 53 transfers the unprocessed substrate W waiting in the load lock chamber 40 to the process chamber 60 or transfers the process completed substrate W to the load lock chamber 40. Further, the second transfer robot 53 may load the substrate W into an interior space 102 of a housing 100 which is to be described below, or unload the substrate W from the interior space 102. Further, the second transfer robot 53 may transfer the substrate W between the process chambers 60 in order to sequentially provide the plurality of process chambers 60 with the substrate W. As illustrated in FIG. 1, when the transfer chamber 50 has a pentagonal body, the load lock chamber 40 is arranged on each of the sidewalls adjacent to the EFEM 20, and a series of process chambers 60 are arranged on the remaining sidewalls. In addition to the above shape, the transfer chamber 50 may be provided in various forms depending on the process module required.

The process chamber 60 may be disposed adjacent to the transfer chamber 50. The process chamber 60 is disposed along a circumference of the transfer chamber 50. The plurality of process chambers 60 may be provided. Within each process chamber 60, a process processing for the substrate W may be performed. The process chamber 60 receives the substrate W from the second transfer robot 53 and perform the process processing, and provides the second transfer robot 53 with the substrate W for which the process processing is completed. The process processing performed in each process chamber 60 may be different from each other.

Hereinafter, a substrate processing apparatus 1000 performing a plasma process in the process chamber 60 will be described. Further, the substrate processing apparatus 1000 described herein is described by way of example as being configured to perform a plasma treatment process on an edge region of the substrate in the process chamber 60. However, without limitation, the substrate processing apparatus 1000 described herein may be identically or similarly applicable to the various chambers in which the substrate is processed. Furthermore, the substrate processing apparatus 1000 may be identically or similarly adapted to various chambers in which the plasma treatment process is performed on the substrate.

FIG. 2 is a diagram illustrating an exemplary embodiment of the substrate processing apparatus provided in the process chamber of FIG. 1. Referring to FIG. 2, the substrate processing apparatus 1000 provided in the process chamber 60 performs a predetermined process on the substrate W by using plasma. For example, the substrate processing apparatus 1000 may etch or ash a film on the substrate W. The film may be various types of films, such as a polysilicon film, a silicon oxide film, and a silicon nitride film. Further, the film may be a natural oxide film or a chemically generated oxide film. Further, the film may be a by-product generated in a process of processing the substrate W. In addition, the film may be an impurity that adheres and/or remains on the substrate W.

The substrate processing unit 1000 may perform a plasma process on the substrate W. For example, the substrate processing apparatus 1000 may supply process gas and generate plasma from the supplied process gas to process the substrate W. The substrate processing apparatus 1000 may supply process gas and generate plasma from the supplied process gas to process an edge region of the substrate W. Hereinafter, the substrate processing apparatus 1000 will be described by way of example as a bevel etch apparatus that performs an etching treatment on an edge region of the substrate W.

The substrate processing apparatus 1000 may include a housing 100, a gap measurement unit 200, a support unit 300, a dielectric plate unit 500, a top electrode unit 600, a temperature control unit 700, a gas supply unit 800, and a controller 900.

The housing 100 may define the interior space 102. The housing 100 may include an upper housing 110 (one example of a first housing) and a lower housing 120 (one example of a second housing). The upper housing 110 and the lower housing 120 may be combined with each other to define the interior space 102. Further, the upper housing 110 may be rotatably engaged to the lower housing 120 by a rotary coupling part 130, which will be described below. For example, the upper housing 110 and the lower housing 120 may be engaged by the rotary coupling part 130, which may be a hinge mechanism.

The upper housing 110 may be in an open position, or in a closed position. Herein, a position of the upper housing 110 in which the upper housing 110 is combined with the lower housing 120 to define the interior space 102 is defined as a closed position, and a position of the upper housing 110 that exposes the interior space 102 to the outside is defined as an open position.

Additionally, the atmosphere of the interior space 102 is isolated from the outside when the upper housing 110 is in the closed position, and the interior space 102 isolated from the outside may be adjusted to a low-pressure state near vacuum (a vacuum-pressure atmosphere) while the substrate W is being processed. Additionally, the housing 100 may be provided from a material including metal. Further, the housing 100 may have an inner surface coated with an insulating material. Further, the housing 100 may be grounded.

Further, the housing 100 may be a vacuum chamber. For example, an exhaust hole 104 may be formed in a bottom surface of the housing 100. Plasma P generated in the interior space 102 or gas G1 and G2 supplied to the interior space 102 may be exhausted to the outside through the exhaust hole 104. Further, by-products generated in the process of processing the substrate W by using the plasma P may be discharged to the outside through the exhaust hole 104. Additionally, the exhaust hole 104 may be connected to an exhaust line (not illustrated). The exhaust line may be connected with a pressure reducing member that provides pressure reduction. The pressure reducing member may provide pressure reduction to the interior space 102 via the exhaust line.

The support unit 300 may support the substrate W in the interior space 102. The support unit 300 may include a chuck 310, a power member 320, an insulating ring 330, a bottom edge electrode 350, and a driving member 370.

The chuck 310 may support the substrate W in the interior space 102. The chuck 310 may have a support surface supporting the substrate W. The chuck 310 may have a circular shape when viewed from the top. The chuck 310 may have a smaller diameter than the substrate W when viewed from the top. Accordingly, a center region of the substrate W supported by the chuck 310 may be seated on the support surface of the chuck 310, and an edge region of the substrate W may not contact the support surface of the chuck 310.

A heating means (not illustrated) may be provided inside the chuck 310. The heating means (not illustrated) may heat the chuck 310. The heating means may be a heater. Further, a cooling flow path 312 may be formed in the chuck 310. The cooling flow path 312 may be formed in the interior of the chuck 310. A cooling fluid supply line 314 and a cooling fluid discharge line 316 may be connected to the cooling flow path 312. The cooling fluid supply line 314 may be connected to a cooling fluid source 318. The cooling fluid source 318 may store a cooling fluid and/or supply a cooling fluid to the cooling fluid supply line 314. Additionally, the cooling fluid supplied to the cooling flow path 312 may be discharged to the outside through the cooling fluid discharge line 316. The cooling fluid stored and/or supplied by the cooling fluid source 318 may be coolant, or may be cooling gas. Further, the shape of the cooling flow path 312 formed in the chuck 310 is not limited to the shape illustrated in FIG. 3 and may be varied. Further, the configuration for cooling the chuck 310 is not limited to a configuration that provides a cooling fluid, but may be provided in various configurations (for example, a cooling plate) that may cool the chuck 310.

The power supply member 320 may supply RF power to the chuck 310. The power member 320 may include a power source 322, a matcher 324, and a power line 326. The power source 322 may be a bias power source. Further, the power source 332 may be an RF power source. The power source 322 may be connected to the chuck 310 via the power line 326. Further, the matcher 324 may be provided on the power line 326 to perform impedance matching.

The insulating ring 330 may be provided to have a ring shape when viewed from the top. The insulating ring 330 may be provided to wrap around the chuck 310 when viewed from the top. For example, the insulating ring 330 may have a ring shape. The insulating ring 330 may be provided with a material having insulating properties.

The bottom edge electrode 350 may be configured to surround the insulating ring 330 when viewed from the top. The bottom edge electrode 350 may have a ring shape when viewed from the top. The lower edge electrode 350 may be grounded. The lower edge electrode 350 may be disposed below an edge region of the substrate W supported by the chuck 310, when viewed from above. The area below the edge region of the substrate W may be an area that overlaps the edge region of the substrate W when viewed from the top, or may be an area that does not overlap.

The driving member 370 may lift the chuck 310. The driving member 370 may include a driver 372 and a shaft 374. The shaft 374 may be coupled with the chuck 310. The shaft 374 may be connected with the driver 372. The actuator 372 may lift the chuck 310 in an up and down direction via the shaft 374. The driving member 370 lifts the chuck 310, so that a gap between the upper surface of the substrate W supported by the chuck 310 and a lower surface of a dielectric plate 520 may be adjusted.

The dielectric plate unit 500 may include a dielectric plate 520, and a first base 510. Further, the dielectric plate unit 500 may be coupled to a temperature control plate 710, which will be described later.

The dielectric plate 520 may be disposed so that its bottom surface faces the top surface of the chuck 310. The dielectric plate 520 may have a circular shape when viewed from the top. Further, the top surface of the dielectric plate 520 may be stepped such that a height of a center region thereof is higher than a height of an edge region thereof. Additionally, the bottom surface of the dielectric plate 520 may be provided with a flat shape. Furthermore, the edge region in the bottom surface of the dielectric plate 520 may be stepped such that the height of the edge region is higher than the height of the center region. The plasma P, which will be described below, is allowed to enter the stepped region in the bottom surface of the dielectric plate 520 to increase processing efficiency for the edge region of the substrate W.

The dielectric plate 520 may be disposed so as to face the upper surface of the substrate W supported by the support unit 300, particularly, the chuck 310, in the interior space 102. The dielectric plate 520 may be disposed above the support unit 300. The dielectric plate 520 may be provided with a material including ceramic. The dielectric plate 520 may have a gas flow path connected to a first gas supply unit 810 of the gas supply unit 800 which will be described below. Further, a discharge end of the gas flow path may be configured so that the first gas G1 supplied by the first gas supply unit 810 is supplied to the center region of the substrate W supported on the support unit 300. Further, the discharge end of the gas flow path may be configured so that the first gas G1 is supplied to an upper surface of the central region of the substrate W supported on the support unit 300.

The first base 510 may be disposed between the dielectric plate 520 and the temperature control plate 710 which will be described later. The first base 510 may be coupled to the temperature control plate 710 which will be described below, and the dielectric plate 520 may be coupled to the first base 510. Accordingly, the dielectric plate 520 may be coupled to the temperature control plate 710 via the first base 510.

The first base 510 may have a diameter that gradually increases from top to bottom. The top surface of the first base 510 may have a smaller diameter than the bottom surface of the dielectric plate 520. The top surface of the first base 510 may have a flat shape. Additionally, the bottom surface of the first base 510 may have a stepped shape. For example, the bottom surface of the edge region of the first base 510 may be stepped to be lower than the bottom surface of the center region. Additionally, the bottom surface of the first base 510 and the top surface of the dielectric plate 520 may have interchangeable shapes. For example, a center region of the dielectric plate 520 may be inserted into a center region of the first base 510. Further, the first base 510 may be provided from a material including metal. For example, the first base 510 may be provided from a material including aluminum. The position of the dielectric plate 520 may be fixed by the first base 510.

The top electrode unit 600 may include a second base 610, and a top edge electrode 620. Further, the top electrode unit 600 may be coupled to the temperature control plate 710, which will be described later. The top edge electrode 620 may be grounded. The top edge electrode 620 may have a shape that surrounds the dielectric plate 520 when viewed from above. The top edge electrode 620 may be provided to be spaced apart from the dielectric plate 520. The top edge electrode 620 may be spaced apart from the dielectric plate 520 to form a spacing space. The spacing space may form a portion of a gas channel through which the second gas G2 supplied by the second gas supply unit 830, which will be described later, flows. The discharge end of the gas channel may be configured to allow the second gas G2 to be supplied to an edge region of the substrate W supported on the support unit 300. Further, the discharge end of the gas channel may be configured such that the second gas G2 is supplied to an upper surface of the edge region of the substrate W supported on the support unit 300.

The top edge electrode 620 may be formed to surround the dielectric plate 520 when viewed from the top. The top edge electrode 620 may have a ring shape when viewed from the top. The top edge electrode 620 may be grounded. The top edge electrode 620 may be disposed above an edge region of the substrate W supported by the chuck 310 when viewed from above. The area above the edge region of the substrate W may be an area that overlaps the edge region of the substrate W when viewed from above, or may be an area that does not overlap.

The second base 610 may be mounted above the chuck 310 and the substrate W supported by the chuck 310. The second base 610 may fix the position of the top edge electrode 620. The second base 610 may be disposed between the top edge electrode 620 and the temperature control plate 710 which will be described later. The second base 610 may be coupled to the temperature control plate 710 which will be described later, and the top edge electrode 620 may be coupled to the second base 610. Accordingly, the top edge electrode 620 may be coupled to the temperature control plate 710 via the second base 610.

The second base 610 may have a ring shape when viewed from the top. The top surface and the bottom surface of the second base 610 may have a flat shape. When viewed from above, the second base 610 may have a shape that surrounds the first base 510. The second base 610 may have an inner diameter gradually increasing from top to bottom. The second base 610 may be provided to be spaced apart from the first base 510. The second base 610 may be spaced apart from the first base 510 to form a spacing space. The spacing space may form a portion of a gas channel through which the second gas G2 supplied by the second gas supply unit 830, which will be described later, flows. Further, the second base 610 may be provided with a material including metal. For example, the second base 610 may be provided with a material including aluminum.

The temperature control unit 700 may include a temperature control plate 710, a fluid block module 720, a fluid supply module 730, and a fluid discharge module 740.

The fluid block module 720, the fluid supply module 730, and the fluid drain module 740 will be described in more detail later.

The temperature control plate 710 may be coupled to the dielectric plate unit 500 and the top electrode unit 600. The temperature control plate 710 may be installed on the ceiling of the upper housing 110. The temperature control plate 710 may be configured to be disposed in the interior space 102 when the upper housing 110 is in the closed position defining the interior space 102. The temperature control plate 710 may prevent the temperature of the first base 510 and the second base 610 from becoming excessively high. For example, the temperature control plate 710 may have a flow path 712 through which a cooling fluid CF which will be described below flows. The cooling fluid CF may be a coolant. Alternatively, the cooling fluid CF may be cooling gas.

According to the exemplary embodiment of the present invention, the first base 510 is disposed between the dielectric plate 520 and the temperature control plate 710. The first base 510 may be provided with a different material from that of the dielectric plate 520, and may be provided with the same material as that of the temperature control plate 710. That is, the thermal expansion rate of the first base 510 may be closer to the thermal expansion rate of the temperature control plate 710 than the thermal expansion rate of the dielectric plate 520. In other words, as the first base 510 is disposed between the dielectric plate 520 and the temperature control plate 710, warping may be minimized between the temperature control plate 710 and the dielectric plate 520 due to cold and heat generated by the temperature control plate 710. This is because the first base 510, which directly contacts the temperature control plate 710, is provided with a material similar to the temperature control plate 710.

Similarly, according to the exemplary embodiment of the present invention, the second base 610 is disposed between the top edge electrode 620 and the temperature control plate 710. The second base 610 may be provided with a different material from that of the top edge electrode 620, and may be provided with the same material as that of the temperature control plate 710. That is, the thermal expansion rate of the second base 610 may be closer to the thermal expansion rate of the temperature control plate 710 than the thermal expansion rate of the top edge electrode 620. In other words, as the second base 610 is disposed between the top edge electrode 620 and the temperature control plate 710, warping may be minimized between the temperature control plate 710 and the top edge electrode 620 due to cold and heat generated by the temperature control plate 710. This is because the second base 610, which directly contacts the temperature control plate 710, is provided with a material similar to that of the temperature control plate 710.

The gas supply unit 800 may supply gas to the interior space 102. The gas supply unit 800 may supply the first gas G1 and the second gas G2 to the interior space 102. The gas supply unit 800 may include the first gas supply unit 810 and the second gas supply unit 830.

The first gas supply unit 810 may supply the first gas G1 to the interior space 102. The first gas G1 may be inert gas, such as nitrogen. The first gas supply unit 810 may supply the first gas G1 to the center region of the substrate W supported by the chuck 310. The first gas supply unit 810 may include a first gas supply source 812, a first gas supply line 814, and a first valve 816. The first gas supply source 812 may supply the first gas G1 and/or supply the first gas G1 to the first gas supply line 814. The first gas supply line 814 may be connected to a flow path formed in the dielectric plate 520. The first valve 816 may be installed in the first gas supply line 814. The first valve 816 may be an on/off valve, or may be provided as a flow control valve. The first gas G1 supplied by the first gas supply source 812 may be supplied to the center region of the top surface of the substrate W through the flow path formed in the dielectric plate 520.

The second gas supply unit 830 may supply the second gas G2 to the interior space 102. The second gas G2 may be a process gas that is excited to a plasma state. The second gas supply part 830 may supply the second gas G2 to the edge region of the substrate W through gas channels formed by the dielectric plate 520, the first base 510, the top edge electrode 620, and the second base 610 spaced apart from each other provided on top of the edge region of the substrate W supported by the chuck 310. The second gas supply part 830 may include a second gas supply source 832, a second gas supply line 834, and a second valve 836. The second gas supply source 832 may store the second gas G2 and/or supply the second gas G2 to the second gas supply line 834. The second gas supply line 814 may supply the second gas G2 to the spacing space that functions as a gas channel. The second valve 836 may be installed in the second gas supply line 834. The second valve 836 may be an on/off valve, or may be provided as a flow control valve. The second gas G2 supplied by the second gas supply source 832 may be supplied to the edge region of the upper surface of the substrate W via the second flow path 602.

The controller 900 may control the substrate processing apparatus 1000. The controller 900 may control the substrate processing apparatus 1000 to perform the plasma treatment process described below. For example, the controller 900 may control the gas supply unit 800, the temperature control plate 710, and the support unit 300. For example, the controller 900 may control the support unit 300, and the gas supply unit 800 such that when gas is supplied from the first gas supply part 810 and/or the second gas supply part 830, the power source 322 applies power to the chuck 310 to generate plasma P at the edge region of the substrate W supported by the chuck 310.

The controller 900 may control the substrate processing apparatus 1000 to perform a substrate processing method described below. Further, the controller 900 may include a process controller formed of a microprocessor (computer) that executes the control of the substrate processing apparatus 1000, a user interface formed of a keyboard in which an operator performs a command input operation or the like in order to manage the substrate processing apparatus 1000, a display for visualizing and displaying an operation situation of the substrate processing apparatus 1000, and the like, and a storage unit storing a control program for executing the process executed in the substrate processing apparatus 1000 under the control of the process controller or a program, that is, a treatment recipe, for executing the process in each component according to various data and processing conditions. Further, the user interface and the storage unit may be connected to the process controller. The processing recipe may be stored in a storage medium in the storage unit, and the storage medium may be a hard disk, and may also be a portable disk, such as a CD-ROM or a DVD, or a semiconductor memory, such as a flash memory.

FIG. 3 is a diagram illustrating an exemplary embodiment of the substrate processing apparatus of FIG. 2 performing a plasma treatment process. Referring to FIG. 3, the substrate processing apparatus 1000 according to the exemplary embodiment of the present invention may process an edge region of the substrate W. For example, the substrate processing apparatus 1000 may process the edge region of the substrate W by generating plasma P at the edge region of the substrate W. For example, the substrate processing apparatus 1000 may perform a bevel-etch process to process the edge region of the substrate W.

To perform the bevel etch process on the substrate W, the driving member 370 may move the chuck 310 in an upward direction, thereby decreasing the gap between the substrate W and the dielectric plate 520.

In the substrate processing apparatus 1000, when the edge region of the substrate W is processed, the first gas supply part 810 may supply the first gas G1 to the center region of the substrate W, and the second gas supply part 830 may supply the second gas G2 to the edge region of the substrate W. Since the second gas G2 supplied by the second gas supply unit 830 is process gas, the second gas G2 may be excited to the plasma P state to process the edge region of the substrate W. For example, a thin film on the edge region of the substrate W may be etched by the plasma P. Furthermore, the first gas G1 supplied to the center region of the substrate W is inert gas, and the first gas G1 prevents the second gas G2 from entering the center region of the substrate W, so that the processing efficiency for the edge region of the substrate W may be further increased.

FIG. 4 is a rear perspective view of the substrate processing apparatus of FIG. 2, when the upper housing is in the closed position, and FIG. 5 is a rear perspective view of the substrate processing apparatus, when the upper housing of FIG. 4 is in the open position.

Referring to FIGS. 4 and 5, the upper housing 110 and the lower housing 120 may be rotatably coupled relative to each other by the rotary coupling part 130 that is a hinge structure. For example, the upper housing 110 may be rotatably engaged with the lower housing 120 by the rotary coupling part 130. The rotary coupling part 130 may be provided in a plurality. For example, the rotary coupling part 130 may include a first rotary coupling part 131 and a second rotary coupling part 132, which will be later. The first rotary coupling part 131 and the second rotary coupling part 132 may be disposed side by side with each other.

When the upper housing 110 is rotated, the interior space 102 may be open or closed. When the upper housing 110 is in the closed position, the upper housing 110 and the lower housing 120 may be combined with each other to define the interior space 102. When the upper housing 120 is in the open position, the interior space 102 may be exposed to the outside.

When the upper housing 120 is in the open position, the temperature control plate 710, the first base 510, the second base 610, the dielectric plate 520, and the top edge electrode 620 that are directly or indirectly engaged with the upper housing 120 may change position with the rotation of the upper housing 120.

The fluid block module 720 described above may be installed on an exterior wall of the upper housing 110. The fluid block module 720 may receive cooling fluid CF from the fluid supply module 730 described above and supply the cooling fluid CF to the flow path 712 of the temperature control plate 710. Further, the fluid block module 720 may receive the cooling fluid CF from the flow path 712 and discharge the used cooling fluid CF to the outside via the fluid discharge module 740 which will be described later.

The fluid block module 720 may include a fluid block 721, a fluid supply channel 723, and a fluid discharge channel 725. The fluid block 721 may be installed in the upper housing 110. The fluid block 721 may be configured to rotate with the upper housing 110 when the upper housing 110 is rotated. The fluid block 721 may be coupled with the fluid supply channel 723 and the fluid discharge channel 725. The fluid supply channel 723 and the fluid drain channel 725 may be configured to rotate with the upper housing 110 when the upper housing 110 is rotated. The fluid supply channel 723 and the fluid discharge channel 725 may each be inserted into a pin hole formed in the rotary coupling part 130. In other words, the fluid supply channel 723 and the fluid discharge channel 725 may function as pipes through which the cooling fluid CF may flow, while also functioning as rotating shafts upon rotation of the upper housing 110.

FIG. 6 is a drawing illustrating a fluid supply structure for supplying a fluid into the housing, and FIG. 7 is a diagram illustrating a fluid discharge structure for discharging a fluid into the housing.

Referring now to FIGS. 6 and 7, as described above, the rotary coupling part 130 may include a first rotary coupling part 131 and a second rotary coupling part 132. The first rotary coupling part 131 and the second rotary coupling part 132 may be disposed side by side with each other.

The first rotary coupling part 131 may include a first-1 hinge part 131*a* coupled to the upper housing 110 and a first-2 hinge part 131*b* coupled to the lower housing 120. A pin hole formed in the first-1 hinge part 131*a* and a pin hole formed in the first-2 hinge part 131*b* may overlap each other. In addition, the first rotary coupling part 131 may further include a first hinge pin 134*a* that penetrates the pin hole in the first-1 hinge part 131*a* and the pin hole in the first-2 hinge part 131*b* at once, and a first bearing 133*a* installed to surround the first hinge pin 134*a*. The first hinge pin 134*a* and the first bearing 133*a* may be independent with respect to the first-1 hinge part 131*a* and the first-2 hinge part 131*b*. That is, the first hinge pin 134*a* and the first bearing 133*a* may have degrees of freedom with respect to rotation of the upper housing 110.

The second rotary coupling part 132 may include a second-1 hinge part 132*a* coupled to the upper housing 110 and a second-2 hinge part 132*b* coupled to the lower housing 120. A pin hole formed in the second-1 hinge part 132*a* and a pin hole formed in the second-2 hinge part 132*b* may overlap each other. In addition, the second rotary coupling part 132 may further include a second hinge pin 134*b* that penetrates the pin hole in the second-1 hinge part 132*a* and the pin hole in the second-2 hinge part 132*b* at once, and a second bearing 133*b* installed to surround the second hinge pin 134*b*. The second hinge pin 134*b* and the second bearing 133*b* may be independent with respect to the second-1 hinge part 132*a* and the second-2 hinge part 132*b*. That is, the second hinge pin 134*b* and the second bearing 133*b* may have degrees of freedom with respect to rotation of the upper housing 110.

The fluid block module 720 may include a fluid block 721, a fluid supply channel 723, and a fluid discharge channel 725.

The fluid block 721 may have a supply flow path 721*a* and a discharge flow path 721*b*. The supply flow path 721*a* and the discharge flow path 721*b* may be in fluid communication with the flow path 712 formed in the temperature control plate 710. That is, when the fluid supply module 730 supplies the cooling fluid CF to the flow path 712 through the supply flow path 721*a*, the cooling fluid CF may circulate through the flow path 712 to cool the temperature control plate 710, and the used cooling fluid CF may be delivered to the fluid discharge module 740 through the discharge flow path 721*b*.

The fluid supply channel 723 may be connected to the supply flow path 721*a*. The fluid discharge channel 725 may be connected with the discharge flow path 721*b*. The fluid block 721 may be coupled to the upper housing 110 and may rotate with the upper housing 110 in response to rotation of the upper housing 110. When the fluid block 721 is rotated, the fluid supply channel 723 and the fluid discharge channel 725 may also be rotated together. The fluid supply channel

723 and the fluid discharge channel 725 may be coaxially rotated with the axis of rotation about which the fluid block 721 is rotated.

The fluid supply module 730 may include a first rotary connector 731, a first fixed connector 732, a first supply pipe 733, and a supply connection pipe 734. The fluid supply module 730 may supply the cooling fluid CF from an exterior side of the housing 100 to the flow path 712.

The first rotary connector 731 may be inserted into the hollow space of the first hinge pin 134*a*.

The first rotary connector 731 may be engaged to rotate with the first hinge pin 134*a*, or may optionally be engaged to be independent of the first hinge pin 134*a* with respect to rotation.

The first rotary connector 731 may have a flow path formed therein through which the cooling fluid CF may flow, and may have one end to which the fluid supply channel 723 is fixedly coupled and the other end to which the a first fixed connector 732 is rotatably coupled. At least a portion of the fluid supply channel 723 may be inserted into the first rotary connector 731. That is, at least a portion of the fluid supply channel 723 may be inserted into the pin hole of the first rotary coupling part 131.

Further, the first fixed connector 732 may be detachably provided to the first rotary connector 731. The first fixed connector 732 may be provided independently of the rotation of the first rotary connector 731. Further, the first fixed connector 732 may be installed between the first supply pipe 733 and the first rotary connector 731. The first fixed connector 732 may deliver the cooling fluid CF supplied by the first supply pipe 733 to the first rotary connector 731 and the fluid supply channel 723.

The first supply pipe 733 may be connected to the second supply pipe 735 via the supply connection pipe 734 that varies the supply path of the cooling fluid CF. The first supply pipe 733, the supply connection pipe 734, and the second supply pipe 735 may be fixedly installed in position.

When the upper housing 110 is rotated, the fluid block 721 may also be rotated. When fluid block 721 is rotated, the fluid supply channel 723 may be rotated. When the fluid supply channel 723 is rotated, the first rotary connector 731 may be rotated. Even if the first rotary connector 731 is rotated, the first fixed connector 732 may not be rotated. The first rotary connector 731 and the first fixed connector 732 may be quick connectors. Since the first fixed connector 732 is not rotated, the cooling fluid CF may be effectively delivered to the flow path 712 of the temperature control plate 710 even when the positions of the first supply pipe 733, the supply connection pipe 734, and the second supply pipe 735 are fixed.

The fluid supply module 740 may include a second rotary connector 741, a second fixed connector 742, a second supply pipe 743, and a discharge connection pipe 744. The fluid supply module 740 may discharge the cooling fluid CF from the flow path 712 of the temperature control plate 710 to an exterior side of the housing 100.

The second rotary connector 741 may be inserted into the hollow space of the second hinge pin 134*b*.

The second rotary connector 741 may be coupled to rotate with the second hinge pin 134*b*, or may optionally be coupled to be independent of the second hinge pin 134*b* with respect to rotation.

The second rotary connector 741 may have a flow path formed therein through which the cooling fluid CF may flow, and may have one end to which the fluid discharge channel 725 is fixedly coupled and the other end to which the second fixed connector 742 is rotatably coupled. At least a portion of the fluid discharge channel 725 may be inserted into the second rotary connector 741. That is, at least a portion of the fluid discharge channel 725 may be inserted into a pin hole in the second rotary coupling part 132.

Additionally, the second fixed connector 742 may be detachably provided to the second rotary connector 741. The second fixed connector 742 may be provided independently of the rotation of the second rotary connector 741. Further, the second fixed connector 742 may be installed between the first discharge pipe 743 and the second rotary connector 741. The cooling fluid CF discharged by the fluid discharge channel 725 may be delivered to the first discharge pipe 743 through the second fixed connector 742.

The first discharge pipe 743 may be connected to the second discharge pipe 745 via the discharge connection pipe 744 that changes the supply path of the cooling fluid CF. The first discharge pipe 743, the discharge connection pipe 744, and the second discharge pipe 745 may be fixedly installed in position.

When the upper housing 110 is rotated, the fluid block 721 may also be rotated. When fluid block 721 is rotated, the fluid discharge channel 725 may be rotated. When the fluid discharge channel 725 is rotated, the second rotary connector 741 may be rotated. Even when the second rotary connector 741 is rotated, the second fixed connector 742 may not be rotated. The second rotary connector 741 and the second fixed connector 742 may be quick connectors. Since the second fixed connector 742 is not rotated, the cooling fluid CF may be effectively discharged into the flow path 712 of the temperature control plate 710 even though the first discharge pipe 743, the discharge connection pipe 744, and the second discharge pipe 745 are fixed in position.

In the structure for selectively opening and closing the interior space 102 of the substrate processing apparatus 1000 in the related art, a flexible line is utilized to supply a fluid, such as a cooling fluid CF, to the interior space 102. In this case, damage is applied to the flexible line as the operation of opening/closing the interior space 102 is repeated, causing damage to the flexible line.

However, according to the fluid supply and discharge structure according to the exemplary embodiment of the present invention, the cooling fluid CF may be supplied and discharged to the interior space 102, and more specifically to the flow path 712 of the temperature control plate 710 disposed in the interior space 102, without using a flexible line. Accordingly, problems arising due to the use of flexible lines (for example, problems of damage to the flexible lines, problems of excessive space occupied by the flexible lines, and the like) may be eliminated.

In the examples described above, the chuck 310 is described as being movable in an upward or downward direction and the positions of the dielectric plate 520 and the top edge electrode 620 are fixed, but the present invention is not limited thereto. For example, the chuck 310 may be configured such that the position of the chuck 310 is fixed and the dielectric plate 520 is movable in the upward and downward directions. Alternatively, both the chuck 310 and the dielectric plate 520 may be configured to be movable in the upward and downward directions.

In addition, while the above example illustrates that the top edge electrode 620 and the bottom edge electrode 350 are grounded, but the present invention is not limited thereto. For example, the top edge electrode 620 and/or the bottom edge electrode 350 may be connected to an RF power source.

The method of generating the plasma P by the substrate processing apparatus 1000 described in the above example may be an Inductively Coupled Plasma (ICP) method. Also, the method of generating the plasma P by the substrate processing apparatus 1000 described in the above example may be a Capacitor Coupled Plasma (CCP) method. Further, the substrate processing apparatus 1000 may generate the plasma P by using both the ICP method and the CCP method, or using a method selected from the ICP method and the CCP method. The substrate processing apparatus 1000 may also generate the plasma P by using a remote plasma method.

The foregoing detailed description illustrates the present invention. Furthermore, the foregoing is described in terms of exemplary embodiments of the invention, and the invention may be used in a variety of other combinations, modifications, and environments. This means that changes or modifications may be made to the scope of the concepts of the invention disclosed herein, to the extent that they are equivalent to the original invention, and/or to the extent of the skill or knowledge in the art. The disclosed exemplary embodiments describe the best state of the art for implementing the technical spirits of the invention, and various changes are possible as required by specific applications and uses of the invention. Accordingly, the foregoing detailed description of the invention is not intended to limit the invention to the disclosed exemplary embodiments. The appended claims should also be construed to include other exemplary embodiments.

The invention claimed is:

1. An apparatus for processing a substrate, the apparatus comprising:
   a first housing;
   a second housing combined with the first housing with each other to define an interior space;
   a rotary coupling part for engaging the first housing and the second housing with each other, such that one of the first housing and the second housing is rotatable relative to the other of the first housing and the second housing;
   a channel for supplying a fluid to the interior space or for discharging the fluid from the interior space, and having at least a portion inserted into a pin hole formed in the rotary coupling part;
   a pipe for supplying or discharging a fluid into or from the channel;
   a rotary connector inserted into a hollow space of the hinge pin, and engaged with the channel and rotating with rotation of the channel; and
   a fixed connector detachably provided to the rotary connector, provided to be independent of rotation of the rotary connector, and installed between the pipe and the rotary connector,
   wherein the rotary coupling part includes:
      a first hinge part coupled with the first housing;
      a second hinge part coupled with the second housing; and
      a hinge pin formed in a hollow shape and inserted into a pin hole in the first hinge part and a pin hole in the second hinge part, and
   wherein the channel is inserted into the hollow space of the hinge pin.

2. An apparatus for processing a substrate, the apparatus comprising:
   a housing, the housing including an upper housing and a lower housing combined with the upper housing to define an interior space;

a rotary coupling part for engaging the upper housing and the lower housing with each other, such that the upper housing is rotatable with respect to the lower housing;

a plate coupled to the upper housing and formed with a flow path through which a fluid flows, wherein when the upper housing is in a closed position defining the interior space, the plate is disposed in the interior space;

a fluid supply module for supplying a fluid from an exterior side of the housing to the flow path;

a fluid discharge module for discharging the fluid from the flow path to the exterior side of the housing; and a fluid block installed on an exterior side of the upper housing, and formed with a supply flow path and a discharge flow path that fluid-communicate with the flow path, wherein at least a portion of a flow path of the fluid flowing by the fluid supply module or the fluid discharge module passes through a pin hole formed in the rotary coupling part, wherein the fluid supply module is configured to supply the fluid to the flow path via the supply flow path, and the fluid discharge module is configured to discharge the fluid from the flow path through the discharge flow path.

3. The apparatus of claim 2, wherein the rotary coupling part includes:

a first hinge part coupled with the upper housing;

a second hinge part coupled with the lower housing; and a hinge pin formed in a hollow shape and inserted into a pin hole in the first hinge part and a pin hole in the second hinge part.

4. The apparatus of claim 3, wherein the fluid supply module includes:

a fluid supply channel connected with the supply flow path;

a rotary connector engaged with the fluid supply channel which rotates with rotation of the upper housing—the rotary connector being inserted into a hollow space of the hinge pin;

a supply pipe for supplying the fluid to the fluid supply channel; and a fixed connector disposed between the rotary connector and the supply pipe, and detachably provided to the rotary connector—the fixed connector being independent of rotation of the rotary connector.

5. The apparatus of claim 3, wherein the fluid discharge module includes:

a fluid discharge channel connected with the discharge channel;

a rotary connector engaged with the fluid discharge channel which rotates with rotation of the upper housing—the rotary connector being inserted into a hollow space of the hinge pin;

a discharge pipe for discharging the fluid from the fluid discharge channel; and a fixed connector disposed between the rotary connector and the discharge pipe, and detachably provided to the rotary connector—the fixed connector being independent of rotation of the rotary connector.

6. The apparatus of claim 2, wherein the fluid supplied by the fluid supply module to the flow path is a cooling fluid that controls a temperature of the plate.

7. The apparatus of claim 2, further comprising:

a chuck for supporting a substrate in the interior space;

a dielectric plate disposed to face an upper surface of the substrate supported by the chuck;

a first gas supply unit for supplying inert gas to a center region of the substrate supported by the chuck;

a second gas supply unit for supplying process gas to an edge region of the substrate supported by the chuck;

a top edge electrode disposed above the edge region of the substrate supported by the chuck;

a lower edge electrode disposed below the edge region of the substrate supported by the chuck; and a power source member for supplying RF power for generating plasma from the process gas.

\* \* \* \* \*